US007800212B2

United States Patent
Yoon et al.

(10) Patent No.: US 7,800,212 B2
(45) Date of Patent: Sep. 21, 2010

(54) MOUNTABLE INTEGRATED CIRCUIT PACKAGE SYSTEM WITH STACKING INTERPOSER

(75) Inventors: In Sang Yoon, Ichon-si (KR); JoHyun Bae, Seoul (KR); HanGil Shin, Ichon-si (KR)

(73) Assignee: Stats Chippac Ltd., Singapore (SG)

( * ) Notice: Subject to any disclaimer, the term of this patent is extended or adjusted under 35 U.S.C. 154(b) by 357 days.

(21) Appl. No.: 11/965,641

(22) Filed: Dec. 27, 2007

(65) Prior Publication Data

US 2009/0166834 A1  Jul. 2, 2009

(51) Int. Cl.
*H01L 23/02* (2006.01)

(52) U.S. Cl. ............... 257/686; 257/685; 257/773; 257/776; 257/E25.006; 257/E25.013; 257/E25.021; 257/E25.027; 257/E23.085; 257/E23.169

(58) Field of Classification Search .......... 257/678, 257/680, 684, 685, 686, 693, 700, 730, 773, 257/776, 778, 779, E23.001–E23.194, 723, 257/777, E25.005, E25.006, E25.021, E25.027, 257/E23.085

See application file for complete search history.

(56) References Cited

U.S. PATENT DOCUMENTS

| | | | |
|---|---|---|---|
| 5,977,640 A | 11/1999 | Bertin et al. | |
| 6,137,164 A | 10/2000 | Yew et al. | |
| 6,650,006 B2 | 11/2003 | Huang et al. | |
| 6,787,916 B2 | 9/2004 | Halahan | |
| 6,861,288 B2 | 3/2005 | Shim et al. | |
| 6,919,627 B2 | 7/2005 | Liu et al. | |
| 7,015,571 B2 | 3/2006 | Chang et al. | |
| 7,026,709 B2 | 4/2006 | Tsai et al. | |
| 7,198,980 B2 | 4/2007 | Jiang et al. | |
| 7,262,074 B2 | 8/2007 | Hall et al. | |
| 7,279,786 B2 | 10/2007 | Kim | |
| 7,288,835 B2 | 10/2007 | Yim et al. | |
| 7,298,033 B2 | 11/2007 | Yoo | |
| 7,309,913 B2 | 12/2007 | Shim et al. | |
| 7,312,518 B2 | 12/2007 | Liao et al. | |
| 7,391,105 B2 | 6/2008 | Yeom | |
| 7,504,284 B2 * | 3/2009 | Ye et al. ............... 438/109 |
| 7,557,443 B2 | 7/2009 | Ye et al. | |
| 2004/0178508 A1 | 9/2004 | Nishimura et al. | |
| 2006/0175695 A1 | 8/2006 | Lee | |
| 2006/0220256 A1 | 10/2006 | Shim et al. | |
| 2006/0244157 A1 | 11/2006 | Carson | |
| 2007/0176275 A1 | 8/2007 | Singleton et al. | |
| 2007/0181990 A1 | 8/2007 | Huang et al. | |
| 2007/0216010 A1 | 9/2007 | Yim et al. | |

* cited by examiner

*Primary Examiner*—Jasmine J Clark
(74) *Attorney, Agent, or Firm*—Mikio Ishimaru

(57) ABSTRACT

A mountable integrated circuit package system includes: forming a base integrated circuit package system includes: providing a first substrate, and forming a package encapsulation having a cavity over the first substrate with the first substrate partially exposed within the cavity; and mounting an interposer including a central aperture over the package encapsulation and the first substrate with the central aperture over the cavity.

18 Claims, 2 Drawing Sheets

MOUNTABLE INTEGRATED CIRCUIT PACKAGE SYSTEM WITH STACKING INTERPOSER

CROSS-REFERENCE TO RELATED APPLICATION(S)

The present application contains subject matter related to co-pending U.S. patent application Ser. No. 11/965,653. The related application is assigned to STATS ChipPAC Ltd.

TECHNICAL FIELD

The present invention relates generally to integrated circuit package system and more particularly to an integrated circuit package system having an encapsulation.

BACKGROUND ART

Integrated circuit packaging technology has seen an increase in the number of integrated circuits mounted on a single circuit board or substrate. The new packaging designs are more compact in form factors, such as the physical size and shape of an integrated circuit, and providing a significant increase in overall integrated circuit density. However, integrated circuit density continues to be limited by the "real estate" available for mounting individual integrated circuits on a substrate. Even larger form factor systems, such as personal computers, compute servers, and storage servers, need more integrated circuits in the same or smaller "real estate". Particularly acute, the needs for portable personal electronics, such as cell phones, digital cameras, music players, personal digital assistants, and location-based devices, have further driven the need for integrated circuit density.

This increased integrated circuit density has led to the development of multi-chip packages, a package in package (PIP), a package on package (POP), or a combination thereof in which more than one integrated circuit can be packaged. Each package provides mechanical support for the individual integrated circuits and one or more layers of interconnect lines that enable the integrated circuits to be connected electrically to surrounding circuitry. Current multi-chip packages, also commonly referred to as multi-chip modules, typically consist of a substrate onto which a set of separate integrated circuit components are attached. Such multi-chip packages have been found to increase integrated circuit density and miniaturization, improve signal propagation speed, reduce overall integrated circuit size and weight, improve performance, and lower costs all of which are primary goals of the computer industry.

Thus, a need still remains for an integrated circuit package system providing low cost manufacturing, improved yield, and thinner height for the integrated circuits. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a mountable integrated circuit package system including: forming a base integrated circuit package system includes: providing a first substrate, and forming a package encapsulation having a cavity over the first substrate with the first substrate partially exposed within the cavity; and mounting an interposer including a central aperture over the package encapsulation and the first substrate with the central aperture over the cavity.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
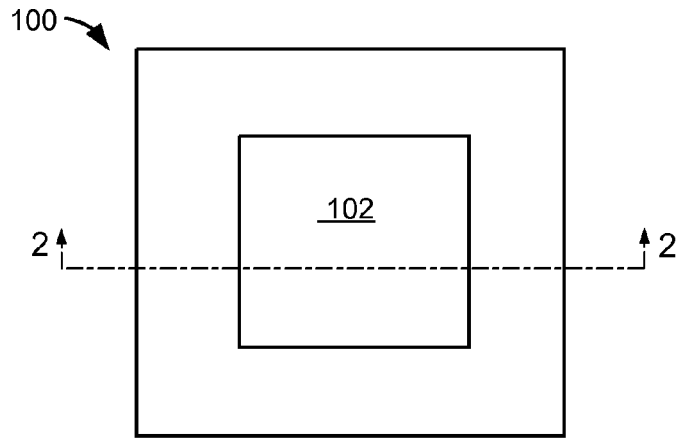
FIG. 1 is a top view of a mountable integrated circuit package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGS. Generally, the invention can be operated in any orientation.

In addition, where multiple embodiments are disclosed and described having some features in common, for clarity and ease of illustration, description, and comprehension thereof, similar and like features one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Referring now to FIG. 1, therein is shown a top view of a mountable integrated circuit package system 100 in a first embodiment of the present invention. The top view depicts a mounting integrated circuit device 102, such as a packaged integrated circuit device of the mountable integrated circuit package system 100. For illustrative purposes, the mountable integrated circuit package system 100 is shown with the mounting integrated circuit device 102 as a packaged integrated circuit, although it is understood that the mountable integrated circuit package system 100 may be formed with different types of integrated circuit device for the mounting integrated circuit device 102. For example, the mounting integrated circuit device 102 may also include a packaged multiple integrated circuits, a ball grid array (BGA) device, a land grid array (LGA) device, a quad flat nonleaded (QFN) device, a quad flat package (QFP) device, a bump chip carrier (BCC) device, a flip chip, a passive component, or a combination thereof.

Figure 2:
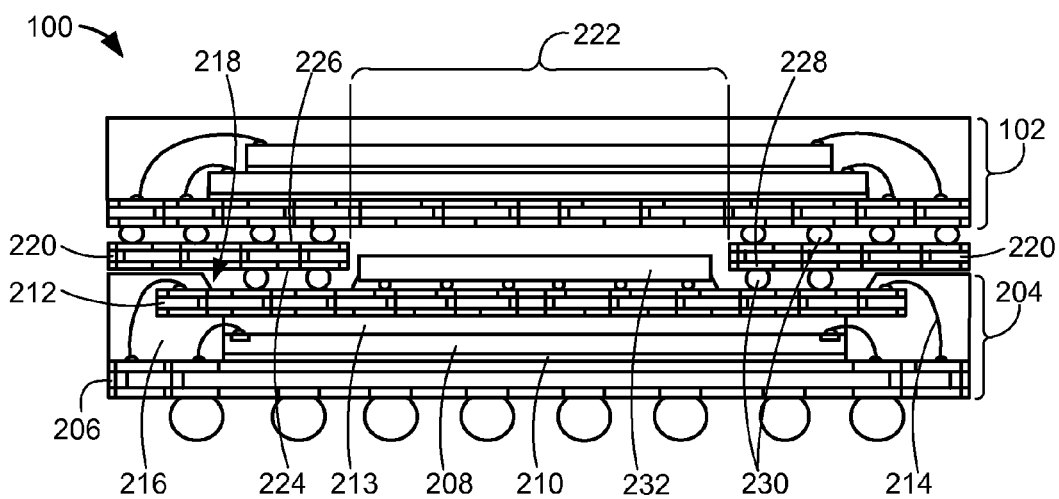
FIG. 2 is a cross-sectional view of the mountable integrated circuit package system of FIG. 1 along line 2--2.

Referring now to FIG. 2, therein is shown a cross-sectional view of the mountable integrated circuit package system 100 along 2-2 of FIG. 1. The cross-sectional view depicts the mountable integrated circuit package system 100 having a base integrated circuit package system 204 that includes a carrier 206, such as a laminate, with an inner integrated circuit device 208, such as an integrated circuit die, a flip chip, or a packaged integrated circuit device, mounted over the carrier 206 with a first adhesive 210, such as a die-attach adhesive. The inner integrated circuit device 208 preferably is a known good package.

A first substrate 212, such as a laminate structure, is mounted over the inner integrated circuit device 208 with a second adhesive 213, such as a wire-in-film adhesive. The first substrate 212 may provide a number of functions, such as may function as an interposer. A first internal interconnect 214, such as a bond wire or a ribbon bond, electrically connects the first substrate 212 to the carrier 206. A package encapsulation 216 with a cavity 218 covers the carrier 206, the inner integrated circuit device 208, the first internal interconnect 214, and partially exposes the first substrate 212 within the cavity 218.

An interposer 220 including a central aperture 222 is mounted over the package encapsulation 216 and the first substrate 212 with the central aperture 222 over the cavity 218. The interposer 220 may include other structures (not shown), such as metal traces, metal layers, insulating layers, electrical vias, and landing pads. The interposer 220 includes a bottom interposer side 224 and a top interposer side 226, opposing the bottom interposer side 224. Preferably, electrical contacts 228, such as metal conductive material or conductive pads, are provided on the top interposer side 226 and the bottom interposer side 224 for further electrical connection.

An electrical connector 230, such as a solder bump, is provided to electrically connect between one of the electrical contacts 228 on the bottom interposer side 224 and the first substrate 212. The package encapsulation 216 and the electrical connector 230 under the bottom interposer side 224 provide further mechanical support and rigidity to the mountable integrated circuit package system 100.

A first integrated circuit device 232, such as an integrated circuit die or a packaged integrated circuit, is mounted over the first substrate 212, within the cavity 218 and within the central aperture 222. The first integrated circuit device 232 preferably is another known good package such that electrical failure is minimized during package assembly of the mountable integrated circuit package system 100.

Although the interposer 220 is described herein prior to the first integrated circuit device 232, it is understood that the order of the assembly of the first integrated circuit device 232 and the interposer 220 being mounted over the first substrate 212 need not be in the order described. The first integrated circuit device 232 may be mounted to the first substrate 212 before mounting the interposer 220, or the first integrated circuit device 232 may be mounted after the mounting of the interposer 220 to the first substrate 212.

As illustrated, the mounting integrated circuit device 102 is mounted over the top interposer side 226 and the first integrated circuit device 232 with the electrical connector 230 connecting between one of the electrical contacts 228 on the top interposer side 226 and the mounting integrated circuit device 102. The package encapsulation 216 and the electrical connector 230 under the bottom interposer side 224 provide mechanical support and rigidity to the mountable integrated circuit package system 100.

Although discussed in the singular, it is understood that more than one of the electrical connector 230 may be provided, such as in a uniformly distributed configuration on the top interposer side 226 and the bottom interposer side 224. It is also understood that the number and the placement of the more than one of the electrical connector 230 may vary, and the placement need not be in a uniformly distributed configuration.

It has been discovered that the present invention provides a low-profile, mountable integrated circuit package system that minimized electrical failure during package assembly by stacking an interposer over a base integrated circuit package system having a first known good package. The interposer including a central aperture is mounted over a cavity of the package encapsulation of the base integrated circuit package system. The interposer is further supported from the bottom in part by the package encapsulation and the electrical connector between the bottom of the interposer and the first substrate of the base integrated circuit package system. The package encapsulation and the electrical connector under the interposer provide further mechanical support and rigidity to the mountable integrated circuit package system.

It has been further discovered that the present invention provides a mountable integrated circuit package system with improved separate packaging process, such as to form a package-on-package device, allowing electrical testing during package assembly.

Figure 3:
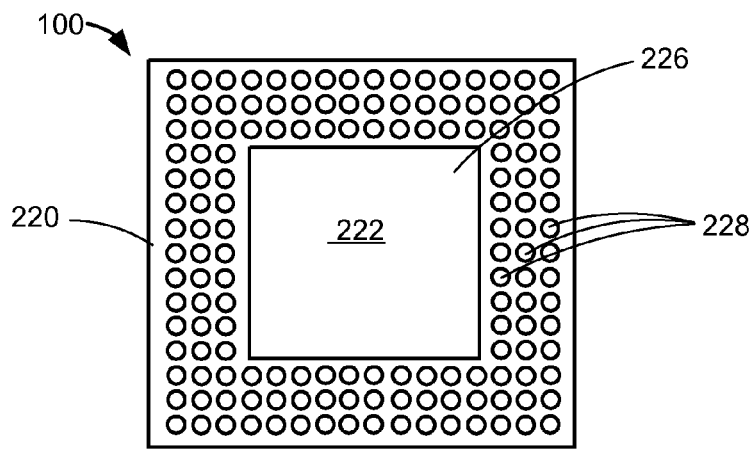
FIG. 3 is a top view of the stacking interposer of the mountable integrated circuit package system of FIG. 1.

Referring now to FIG. 3, therein is shown a top view of the interposer 220 having the central aperture 222 of the mountable integrated circuit package system 100 of FIG. 2. As shown, the interposer 220 includes the central aperture 222 and the top interposer side 226 with the electrical contacts 228 for further electrical connection. For illustrative purposes, the electrical contacts 228 are shown in a uniformly distributed configuration, although it is understood that the electrical contacts 228 may be provided in a different or non-uniformly distributed configuration. Further, although not shown, it is understood that the electrical contacts 228 may also be provided on an opposing side to the top interposer side 226 as shown in FIG. 2.

Figure 4:
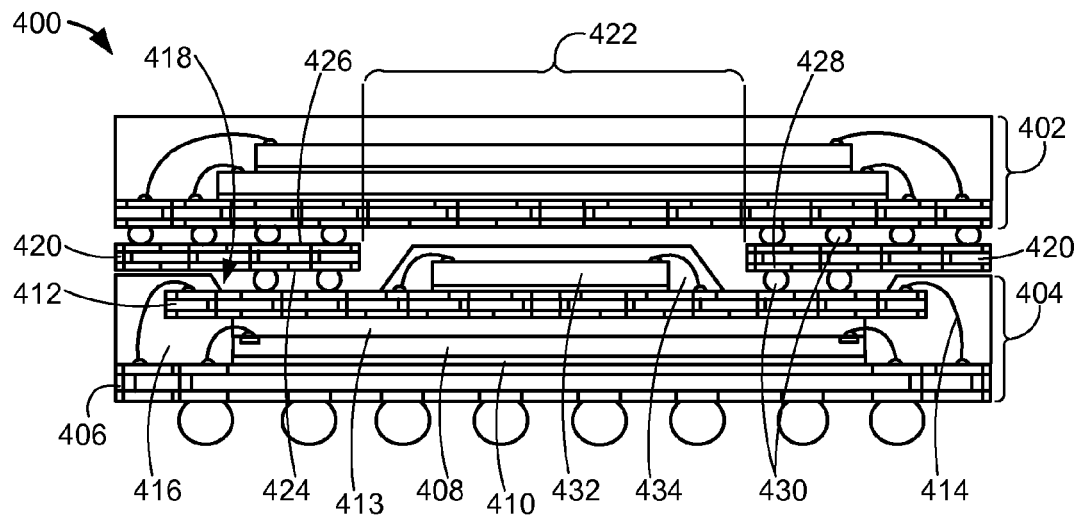
FIG. 4 is a cross-sectional view of a mountable integrated circuit package system as exemplified by the top view of FIG. 1 in a second embodiment of the present invention.

Referring now to FIG. 4, therein is shown a cross-sectional view of a mountable integrated circuit package system 400 as exemplified by the top view of FIG. 1 in a second embodiment of the present invention. The cross-sectional view depicts the mountable integrated circuit package system 400 having a base integrated circuit package system 404 that includes a carrier 406, such as a laminate, with an inner integrated circuit device 408, such as a packaged integrated circuit device, mounted over the carrier 406 with a first adhesive 410, such as a die-attach adhesive. The inner integrated circuit device 408 preferably is a known good package.

A first substrate 412, such as a laminate structure, is mounted over the inner integrated circuit device 408 with a second adhesive 413, such as a wire-in-film adhesive. The first substrate 412 may provide a number of functions, such as may function as an interposer. A first internal interconnect 414, such as a bond wire or a ribbon bond, electrically connects the first substrate 412 to the carrier 406. The first internal interconnect 414 may also electrically connect the inner integrated circuit device 408 to the carrier 406. A package encapsulation 416 with a cavity 418 covers the carrier 406, the inner integrated circuit device 408, the first internal interconnect 414, and partially exposes the first substrate 412 within the cavity 418.

An interposer 420 having a central aperture 422 is mounted over the package encapsulation 416 and the first substrate 412 with the central aperture 422 over the cavity 418. The interposer 420 may include other structures (not shown), such as metal traces, metal layers, insulating layers, electrical vias, and landing pads. The interposer 420 includes a bottom interposer side 424 and a top interposer side 426, opposing the bottom interposer side 424. Preferably, electrical contacts 428, such as of metal conductors, are provided on the top interposer side 426 and the bottom interposer side 424.

An electrical connector 430, such as a solder bump, is provided to electrically connect between one of the electrical contacts 428 on the bottom interposer side 424 and the first substrate 412. The package encapsulation 416 and the electrical connector 430 under the bottom interposer side 424 provide further mechanical support and rigidity to the mountable integrated circuit package system 400.

A first integrated circuit device 432 having a first encapsulation 434, such as a packaged integrated circuit, is mounted over the first substrate 412, within the cavity 418 and within the central aperture 422. The first integrated circuit device 432 preferably is another known good package such that electrical failure is minimized during package assembly of the mountable integrated circuit package system 400.

Although the interposer 420 is described herein prior to the first integrated circuit device 432, it is understood that the order of the assembly of the first integrated circuit device 432 and the interposer 420 being mounted over the first substrate 412 need not be in the order described. The first integrated circuit device 432 may be mounted to the first substrate 412 before mounting the interposer 420, or the first integrated circuit device 432 may be mounted after the mounting of the interposer 420 to the first substrate 412.

As illustrated, a mounting integrated circuit device 402 is mounted over the top interposer side 426 and the first integrated circuit device 432 with the electrical connector 430 connecting between one of the electrical contacts 428 on the top interposer side 426 and the mounting integrated circuit device 402. For illustrative purposes, the mountable integrated circuit package system 400 is shown with the mounting integrated circuit device 402 as a packaged integrated circuit, although it is understood that the mountable integrated circuit package system 400 may be formed with different types of integrated circuit device for the mounting integrated circuit device 402. For example, the mounting integrated circuit device 402 may also include a packaged multiple integrated circuits, a ball grid array (BGA) device, a land grid array (LGA) device, a quad flat nonleaded (QFN) device, a quad flat package (QFP) device, a bump chip carrier (BCC) device, a flip chip, a passive component, or a combination thereof.

Although discussed in the singular, it is understood that more than one of the electrical connector 430 may be provided, such as in a uniformly distributed configuration on the top interposer side 426 and the bottom interposer side 424. It is also understood that the number and the placement of the more than one of the electrical connector 430 may vary, and the placement need not be in a uniformly distributed configuration.

Figure 5:
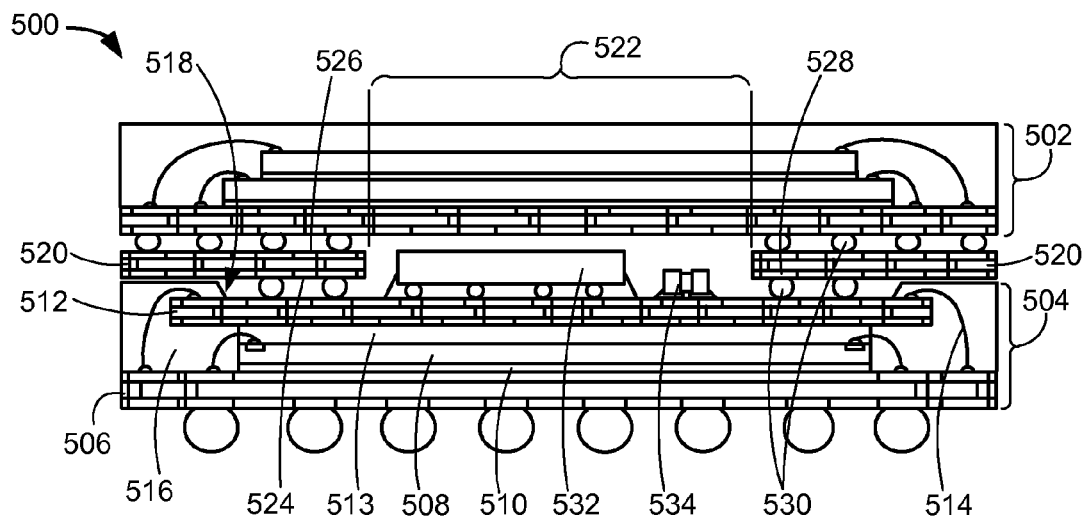
FIG. 5 is a cross-sectional view of a mountable integrated circuit package system as exemplified by the top view of FIG. 1 in a third embodiment of the present invention.

Referring now to FIG. 5, therein is shown a cross-sectional view of a mountable integrated circuit package system 500 as exemplified by the top view of FIG. 1 in a third embodiment of the present invention. The cross-sectional view depicts a mountable integrated circuit package system 500 having a base integrated circuit package system 504 that includes a carrier 506, such as a laminate, with an inner integrated circuit device 508, such as an integrated circuit die, a flip chip, or a packaged integrated circuit device, mounted over the carrier 506 with a first adhesive 510, such as a die-attach adhesive. The inner integrated circuit device 508 preferably is a known good package.

A first substrate 512, such as a laminate structure, is mounted over the inner integrated circuit device 508 with a second adhesive 513, such as a wire-in-film adhesive. The first substrate 512 may provide a number of functions, such as may function as an interposer. A first internal interconnect 514, such as a bond wire or a ribbon bond, electrically connects the first substrate 512 to the carrier 506. A package encapsulation 516 with a cavity 518 covers the carrier 506, the inner integrated circuit device 508, the first internal interconnect 514, and partially exposes the first substrate 512 within the cavity 518.

An interposer 520 including a central aperture 522 is mounted over the package encapsulation 516 and the first substrate 512 with the central aperture 522 over the cavity 518. The interposer 520 may include other structures (not shown), such as metal traces, metal layers, insulating layers, electrical vias, and landing pads. The interposer 520 includes a bottom interposer side 524 and a top interposer side 526, opposing the bottom interposer side 524. Preferably, electrical contacts 528, such as metal conductors, are provided on the top interposer side 526 and the bottom interposer side 524 for further electrical connection.

An electrical connector 530, such as a solder bump, is provided to electrically connect between one of the electrical contacts 528 and the top interposer side 526. The electrical connector 530 may also connect a mounting integrated circuit device 502 and the top interposer side 526. The package encapsulation 516 and the electrical connector 530 under the bottom interposer side 524 provide further support and rigidity to the mountable integrated circuit package system 500.

A first integrated circuit device 532, such as an integrated circuit die or a packaged integrated circuit is mounted over the first substrate 512, within the cavity 518 and within the central aperture 522. The first integrated circuit device 532 preferably is another known good package such that electrical failure is minimized during package assembly of the mountable integrated circuit package system 500.

Although the interposer 520 is described herein prior to the first integrated circuit device 532, it is understood that the order of the assembly of the first integrated circuit device 532 and the interposer 520 being mounted over the first substrate 512 need not be in the order described. The first integrated circuit device 532 may be mounted to the first substrate 512 before mounting the interposer 520, or the first integrated circuit device 532 may be mounted after the mounting of the interposer 520 to the first substrate 512.

As illustrated, the mounting integrated circuit device 502 is mounted over the top interposer side 526 with the electrical connector 530 connecting between one of the electrical contacts 528 on the top interposer side 526 and the mounting integrated circuit device 502. For illustrative purposes, the mountable integrated circuit package system 500 is shown with the mounting integrated circuit device 502 as a packaged integrated circuit, although it is understood that the mountable integrated circuit package system 500 may be formed with different types of integrated circuit device for the mounting integrated circuit device 502. For example, the mounting integrated circuit device 502 may also include a packaged multiple integrated circuits, a ball grid array (BGA) device, a land grid array (LGA) device, a quad flat nonleaded (QFN) device, a quad flat package (QFP) device, a bump chip carrier (BCC) device, a flip chip, a passive component, or a combination thereof.

Although discussed in the singular, it is understood that more than one of the electrical connector 530 may be provided, such as in a uniformly distributed configuration on the top interposer side 526 and the bottom interposer side 524. It is also understood that the number and the placement of the more than one of the electrical connector 530 may vary, and the placement need not be in a uniformly distributed configuration.

Optionally, a passive device 534, such as a resistor device or a capacitor device, may be mounted on the first substrate 512 adjacent to the first integrated circuit device 532 within the cavity 518 and the central aperture 522. Although the passive device 534 is shown within the central aperture 522, it is understood that the passive device 534 may be mounted on the first substrate 512 within the cavity 518, but not within the central aperture 522

Figure 6:
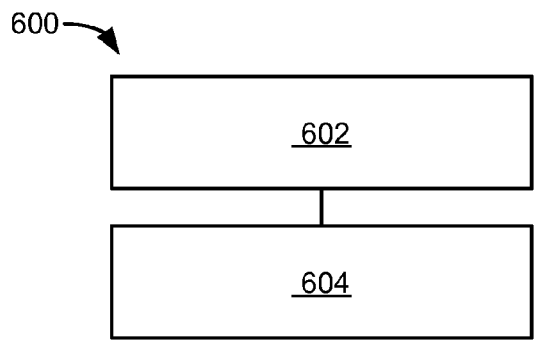
FIG. 6 is a flow chart of a mountable integrated circuit package system for manufacture of the mountable integrated circuit package system in an embodiment of the present invention.

Referring now to FIG. 6, therein is shown a flow chart of a mountable integrated circuit package system 600 for manufacture of the mountable integrated circuit package system in an embodiment of the present invention. The mountable integrated circuit package system 600 includes: forming a base integrated circuit package system includes: providing a first substrate, and forming a package encapsulation having a cavity over the first substrate with the first substrate partially exposed within the cavity in a block 602; and mounting an interposer including a central aperture over the package encapsulation and the first substrate with the central aperture over the cavity in a block 604.

It has been discovered that the present invention improves yield and reliability of the mountable integrated circuit package system by improving the mechanical support and rigidity for supporting a mounting integrated circuit device over a base integrated circuit package system.

It has been further discovered that the present invention provides a mountable integrated circuit package system with improved separate packaging process, such as to form a package-on-package device, allowing electrical testing during package assembly.

Yet other important aspects of the embodiments include that it valuably supports and services the historical trend of reducing costs, simplifying systems, and increasing performance.

These and other valuable aspects of the embodiments consequently further the state of the technology to at least the next level.

Thus, it has been discovered that the mountable integrated circuit package system of the present invention furnishes important and heretofore unknown and unavailable solutions, capabilities, and functional aspects for improving reliability in systems. The resulting processes and configurations are straightforward, cost-effective, uncomplicated, highly versatile, and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A mountable integrated circuit package system comprising:
    forming a base integrated circuit package system includes:
        providing a first substrate, and
        forming a package encapsulation having a cavity over the first substrate with the first substrate partially exposed within the cavity;
    mounting an interposer including a central aperture over the package encapsulation and the first substrate with the central aperture over the cavity; and
    mounting a first integrated circuit device over the first substrate within the central aperture.

2. The system as claimed in claim 1 further comprising providing an electrical connector between the interposer and the first substrate.

3. The system as claimed in claim 1 further comprising mounting a mounting integrated circuit device over the interposer.

4. The system as claimed in claim 1 further comprising mounting a first integrated circuit device having a first encapsulation.

5. A mountable integrated circuit package system comprising:
    forming a base integrated circuit package system includes:
        providing a carrier having an inner integrated circuit device thereover,
        mounting a first substrate over the inner integrated circuit device, and
        forming a package encapsulation having a cavity over the first substrate, the inner integrated circuit device, and the carrier with the first substrate partially exposed within the cavity; and
    mounting an interposer including a central aperture over the package encapsulation and the first substrate with the central aperture over the cavity.

6. The system as claimed in claim 5 wherein mounting the interposer includes:
    mounting the interposer having a bottom interposer side with electrical contacts; and
    connecting an electrical connector between one of the electrical contacts and the first substrate.

7. The system as claimed in claim 5 wherein forming the package encapsulation includes:
    connecting a first internal interconnect between the first substrate and the carrier; and
    forming the package encapsulation over the carrier, the inner integrated circuit device, the first internal interconnect, and partially exposing the first substrate within the cavity.

8. The system as claimed in claim 5 further comprising:
mounting a mounting integrated circuit device over the interposer; and
connecting an electrical connector between the mounting integrated circuit device and the interposer.

9. The system as claimed in claim 5 further comprising mounting a passive device over the first substrate within the cavity.

10. A mountable integrated circuit package system comprising:
a base integrated circuit package system including:
a first substrate; and
a package encapsulation having a cavity formed over the first substrate with the first substrate partially exposed within the cavity;
an interposer including a central aperture mounted over the package encapsulation and the first substrate with the central aperture over the cavity; and
a first integrated circuit device mounted over the first substrate within the central aperture.

11. The system as claimed in claim 10 further comprising an electrical connector connected between the interposer and the first substrate.

12. The system as claimed in claim 10 further comprising a mounting integrated circuit device mounted over the interposer.

13. The system as claimed in claim 10 further comprising a first integrated circuit device having a first encapsulation.

14. The system as claimed in claim 10 wherein the base integrated circuit package system includes:
a carrier having an inner integrated circuit device mounted thereover;
the first substrate mounted over the inner integrated circuit device; and
the package encapsulation formed over the first substrate, the inner integrated circuit device, and the carrier.

15. The system as claimed in claim 14 wherein:
the interposer includes a bottom interposer side with a first electrical contact and a top interposer side with a second electrical contact; and further comprising:
an electrical connector connected between the second electrical contact and the first substrate.

16. The system as claimed in claim 14 further comprising:
a first internal interconnect connected between the first substrate and the carrier; and
wherein the package encapsulation is over the carrier, the inner integrated circuit device, the first internal interconnect, and partially exposing the first substrate within the cavity.

17. The system as claimed in claim 14 further comprising:
a mounting integrated circuit device mounted over the interposer; and
an electrical connector connected between the mounting integrated circuit device and the interposer.

18. The system as claimed in claim 14 further comprising a passive device mounted over the first substrate within the cavity.

* * * * *